(12) United States Patent
Fu et al.

(10) Patent No.: US 10,564,414 B2
(45) Date of Patent: Feb. 18, 2020

(54) ELECTROSTATIC SCANNER MONITORING SPRING STRESSES

(71) Applicant: Ultimems, Inc., New Taipei (TW)

(72) Inventors: Yee-Chung Fu, Fremont, CA (US); Han-Tang Su, Taichung (TW)

(73) Assignee: ULTIMEMS, INC., New Taipei (TW)

( * ) Notice: Subject to any disclaimer, the term of this patent is extended or adjusted under 35 U.S.C. 154(b) by 47 days.

(21) Appl. No.: 16/033,221

(22) Filed: Jul. 12, 2018

(65) Prior Publication Data

US 2019/0018233 A1 Jan. 17, 2019

Related U.S. Application Data

(60) Provisional application No. 62/531,870, filed on Jul. 12, 2017.

(51) Int. Cl.
*G02B 26/08* (2006.01)
*G02B 26/10* (2006.01)
*G01R 29/12* (2006.01)

(52) U.S. Cl.
CPC ......... *G02B 26/0841* (2013.01); *G01R 29/12* (2013.01); *G02B 26/101* (2013.01)

(58) Field of Classification Search
CPC .. G02B 26/0841; G02B 26/101; G02B 26/08; G01R 29/12
USPC ........................................................ 359/223.1
See application file for complete search history.

(56) References Cited

U.S. PATENT DOCUMENTS

| | | | |
|---|---|---|---|
| 7,014,115 B2 | 3/2006 | Fu | |
| 7,538,927 B1 | 5/2009 | Fu | |
| 9,201,239 B1 | 12/2015 | Fu | |
| 2007/0279726 A1* | 12/2007 | Kato | G02B 26/085 359/224.1 |
| 2017/0328942 A1 | 11/2017 | Fu et al. | |

* cited by examiner

*Primary Examiner* — Euncha P Cherry
(74) *Attorney, Agent, or Firm* — Chen-Chi Lin

(57) ABSTRACT

An electrostatic scanner has a mirror, a first outer slow-scan spring, a second outer slow-scan spring, a plurality of out-of-plane comb assemblies, circuitry for voltage or resistance measurement. Angular positions of a mirror can be determined by changes of resistance of deformed springs located in a leg of the circuitry. The determined angular positions of the mirror can be used for feedback control. The mirror is a one-dimensional mirror to rotate about a first axis or a two-dimensional mirror to rotate about the first axis and a second axis perpendicular to the first axis. In one example, the circuitry is Wheatstone bridge circuitry.

14 Claims, 9 Drawing Sheets

ELECTROSTATIC SCANNER MONITORING SPRING STRESSES

CROSS-REFERENCE TO RELATED APPLICATIONS

This patent application claims benefit of a provisional patent application 62/531,870. The disclosure made in the provisional patent application 62/531,870 is hereby incorporated by reference. U.S. Pat. No. 7,014,115 to Fu, U.S. Pat. No. 7,538,927 to Fu, U.S. Pat. No. 9,201,239 to Fu and U.S. Pat. Appl. Publication No. 2017/0328942 to Fu et al. are hereby incorporated by reference.

FIELD OF THE INVENTION

This invention relates generally to an electrostatic scanner. More particularly, the present invention relates to a Micro-Electro Mechanical Systems (MEMS) electrostatic scanner monitoring spring stresses.

BACKGROUND OF THE INVENTION

U.S. Pat. No. 7,014,115 to Fu discloses a MEMS scanning mirror with distributed hinges and multiple support attachments. FIG. 1A, 1B, 1C, 2, 3, and 4 of U.S. Pat. No. 7,538,927 to Fu discloses a process to construct a scanning mirror with short vertical combteeth in a vertical comb drive and long in-plane combteeth in an in-plane comb drive. U.S. Pat. No. 9,201,239 to Fu discloses a two-dimensional electrostatic scanner with distributed springs. U.S. patent application Ser. No. 15/489,752 to Fu et al. determines angular positions of a mirror from measured capacitance from sensing comb assemblies. This invention discloses an electrostatic scanner monitoring spring stresses. In one example, the electrostatic scanner has Wheatstone bridge circuitry. One of the advantages of the present invention is that angular positions of a mirror can be determined by changes of resistance of deformed springs located in a leg of Wheatstone bridge circuitry. The determined angular positions of the mirror can be used for feedback control.

SUMMARY OF THE INVENTION

This invention discloses an electrostatic scanner comprising a mirror, a first outer slow-scan spring, a second outer slow-scan spring, a plurality of out-of-plane comb assemblies, and circuitry for voltage or resistance measurement. The mirror is a one-dimensional mirror to rotate about a first axis or a two-dimensional mirror to rotate about the first axis and a second axis perpendicular to the first axis.

DETAILED DESCRIPTION OF THE INVENTION

Figure 1:
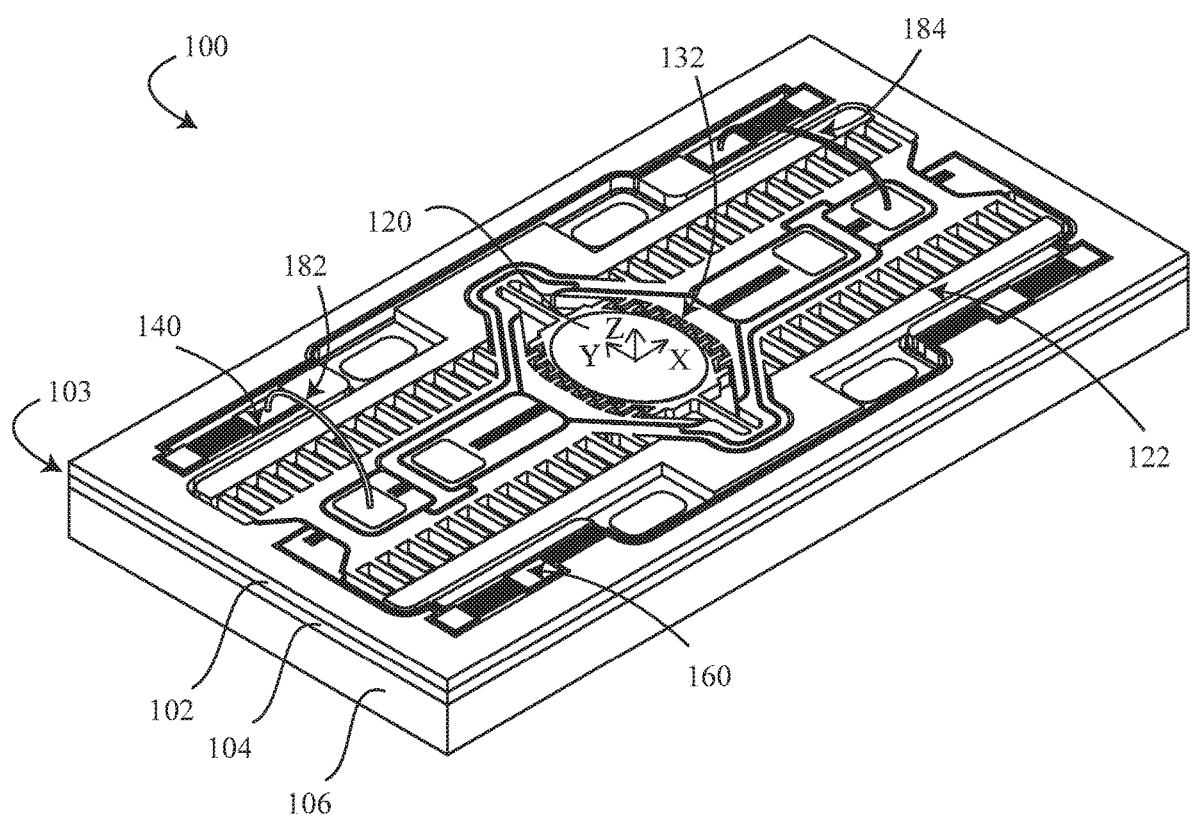
FIG. 1 is a schematic perspective view of an electrostatic scanner in examples of the present disclosure.

FIG. 1 is a schematic perspective view of an electrostatic scanner 100 in examples of the present disclosure. The electrostatic scanner 100 includes a device layer 102, an insulation layer 103, a supporting layer 104 and a substrate 106 along the Z-axis. In examples of the present disclosure, the device layer 102 is made of a silicon material. The insulation layer 103 is made of a silicon dioxide material. The supporting layer 104 is made of a silicon material. The substrate 106 is made of a glass material.

Figure 5:
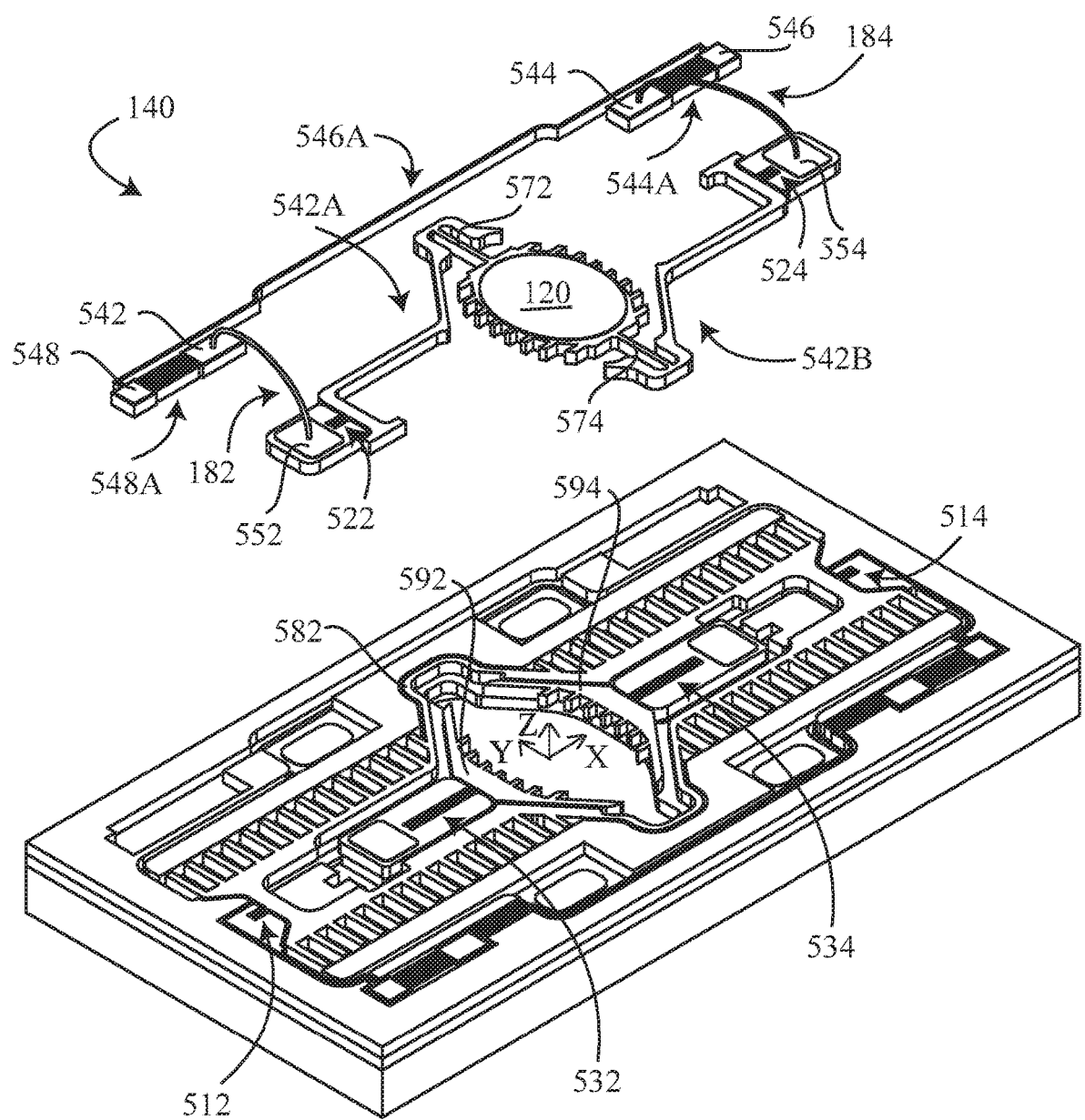
FIG. 5 is an exploded plot of the electrostatic scanner of FIG. 1 having a first Wheatstone bridge circuitry above other components in examples of the present disclosure.

As shown in FIGS. 1 and 5, the electrostatic scanner 100 has a mirror 120, a first outer slow-scan spring 512, a second outer slow-scan spring 514, a first mid-range slow-scan spring 522, a second mid-range slow-scan spring 524, a first inner slow-scan spring 532, a second inner slow-scan spring 534, a first fast-scan spring 572, a second fast-scan spring 574, a plurality of out-of-plane comb assemblies 122, a plurality of in-plane comb assemblies 132, a first Wheatstone bridge circuitry 140 and a second Wheatstone bridge circuitry 160. A first wire 182 and a second wire 184 are part of the first Wheatstone bridge circuitry 140. In examples of the present disclosure, a Wheatstone bridge circuitry is a resistance monitoring circuitry.

The mirror 120 is to rotate about the X-axis and to rotate about the Y-axis. In examples of the present disclosure, the mirror 120 rotates about the X-axis at a slow-scan frequency in a range from 59 hertz to 61 hertz. The mirror 120 rotates about the Y-axis at a fast-scan frequency in a range from 27,000 hertz to 29,000 hertz. The first outer slow-scan spring 512, the second outer slow-scan spring 514, the first mid-range slow-scan spring 522, the second mid-range slow-scan spring 524, the first inner slow-scan spring 532 and the second inner slow-scan spring 534 are to rotate about the X-axis. The first fast-scan spring 572 and the second fast-scan spring 574 are to rotate about the Y-axis.

Each of the first outer slow-scan spring 512, the second outer slow-scan spring 514, the first mid-range slow-scan spring 522, the second mid-range slow-scan spring 524, the first inner slow-scan spring 532, the second inner slow-scan spring 534, the first fast-scan spring 572 and the second fast-scan spring 574 may be a linear spring or a serpentine spring.

In examples of the present disclosure, centerlines of the first outer slow-scan spring 512, the second outer slow-scan spring 514, the first mid-range slow-scan spring 522, the second mid-range slow-scan spring 524, the first inner slow-scan spring 532 and the second inner slow-scan spring 534 are aligned along the X-axis. The first mid-range slow-scan spring 522 is between the first outer slow-scan spring 512 and the first inner slow-scan spring 532. The second mid-range slow-scan spring 524 is between the second outer slow-scan spring 514 and the second inner slow-scan spring 534. The first inner slow-scan spring 532 is between the first mid-range slow-scan spring 522 and the mirror 120. The second inner slow-scan spring 534 is between the second mid-range slow-scan spring 524 and the mirror 120. The mirror 120 is between the first inner slow-scan spring 532 and the second inner slow-scan spring 534. In examples of the present disclosure, centerlines of the first fast-scan spring 572 and the second fast-scan spring 574 are aligned the Y-axis. The mirror 120 is between the first fast-scan spring 572 and the second fast-scan spring 574.

The first mid-range slow-scan spring 522, the first fast-scan spring 572, the mirror 120, the second fast-scan spring 574 and the second mid-range slow-scan spring 524 are electrically and mechanically connected forming a portion 542B of a first leg 542A of the first Wheatstone bridge circuitry 140. In examples of the present disclosure, the first Wheatstone bridge circuitry 140 is a mixed-scan Wheatstone bridge circuitry because the first leg 542A includes both fast-scan springs and slow-scan springs.

The portion 542B of the first leg 542A of the first Wheatstone bridge circuitry 140 is electrically isolated from the first outer slow-scan spring 512 and the second outer slow-scan spring 514. The portion 542B of the first leg 542A of the first Wheatstone bridge circuitry 140 is electrically isolated from the first inner slow-scan spring 532 and the second inner slow-scan spring 534.

Figure 2:
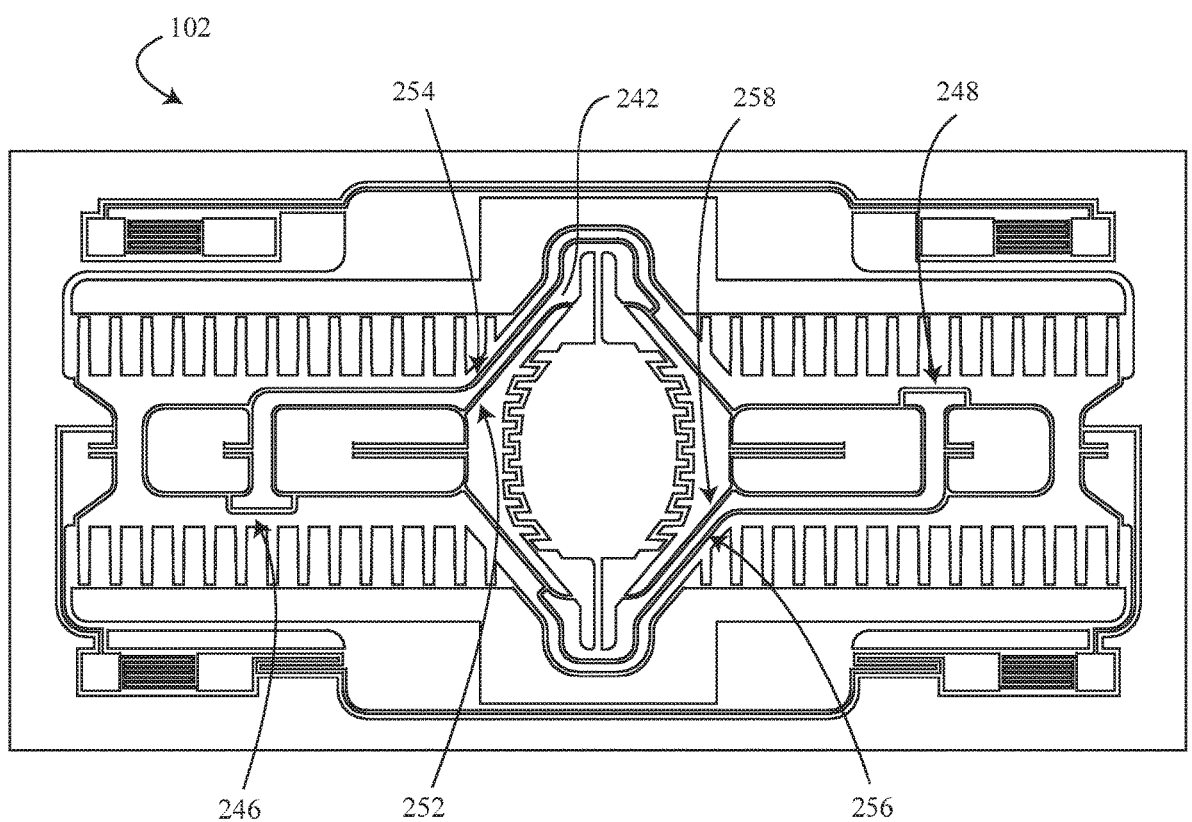
FIG. 2 is a top view of a device layer of the electrostatic scanner of FIG. 1 in examples of the present disclosure.

FIG. 2 is a top view of the device layer 102 of the electrostatic scanner 100 of FIG. 1 in examples of the present disclosure. As shown in FIGS. 2 and 5, a plurality of trenches 246, 248, 252, 254, 256 and 258 surround the portion 542B of the first leg 542A of the first Wheatstone bridge circuitry 140. The portion 542B of the first leg 542A of the first Wheatstone bridge circuitry 140 includes a plurality of mid-range connecting sections 242. Trenches 254 and 256 separate the plurality of mid-range connecting sections 242 from a plurality of outer connecting sections 582. Trench 252 separate the plurality of mid-range connecting sections 242 from a first inner connecting section 592. Trench 258 separate the plurality of mid-range connecting sections 242 from a first inner connecting section 594. The first inner slow-scan spring 532 is connected to the first inner connecting section 592. The second inner slow-scan spring 534 is connected to the second inner connecting section 594.

Figure 3:
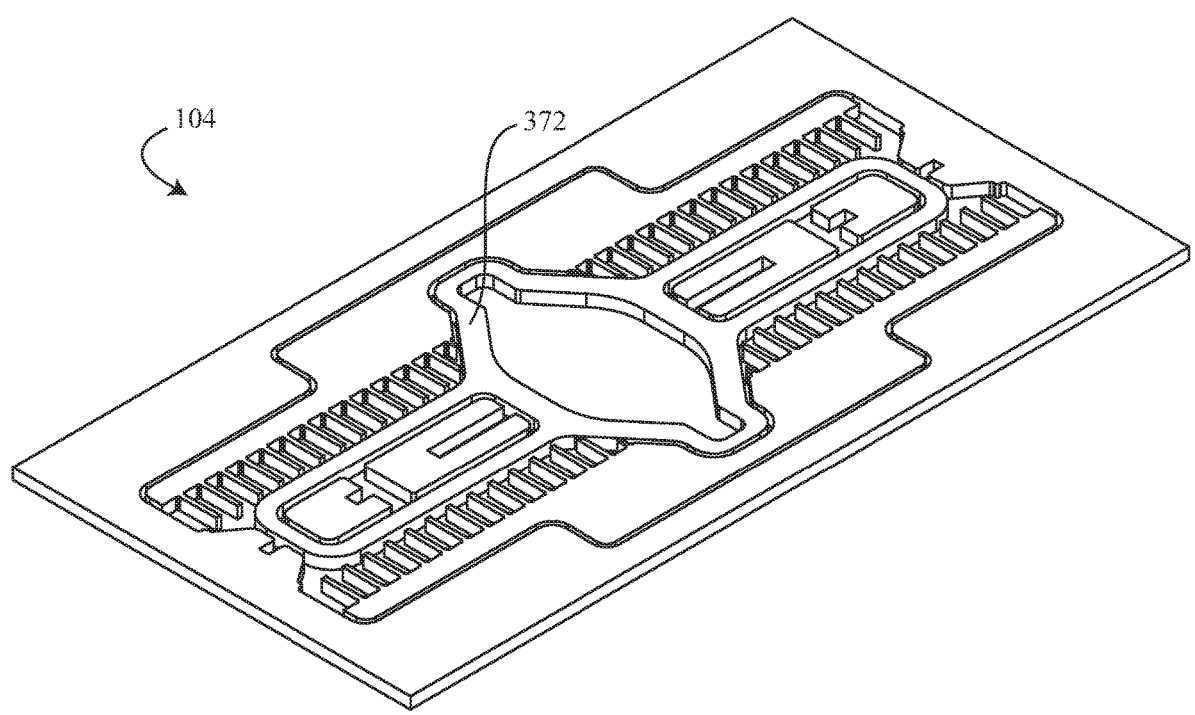
FIG. 3 is a schematic perspective view of a supporting layer of the electrostatic scanner of FIG. 1 in examples of the present disclosure.

FIG. 3 is a schematic perspective view of the supporting layer 104 of the electrostatic scanner 100 of FIG. 1 in examples of the present disclosure. The supporting layer 104 includes a supporting frame 372. As shown in FIGS. 1, 2, 3 and 5, the device layer 102 includes the portion 542B of the first leg 542A of the first Wheatstone bridge circuitry 140, the first outer slow-scan spring 512 and the second outer slow-scan spring 514. The portion 542B of the first leg 542A of the first Wheatstone bridge circuitry 140, the first outer slow-scan spring 512 and the second outer slow-scan spring 514 are directly or indirectly attached to a portion of the insulation layer 103. The plurality of mid-range connecting sections 242, the plurality of outer connecting sections 582, the first inner connecting section 592 and the second inner connecting section 594 are directly attached to the portion of the insulation layer 103. The portion of the insulation layer 103 is directly attached to the supporting frame 372. The portion 542B of the first leg 542A of the first Wheatstone bridge circuitry 140 and the first outer slow-scan spring 512 are not mechanically connected and are separated by a first plurality of trenches including trenches 246, 248, 254 and 256. The portion 542B of the first leg 542A of the first Wheatstone bridge circuitry 140 and the first inner slow-scan spring 532 are not mechanically connected and are separated by a second plurality of trenches including trenches 252 and 258.

Figure 4:
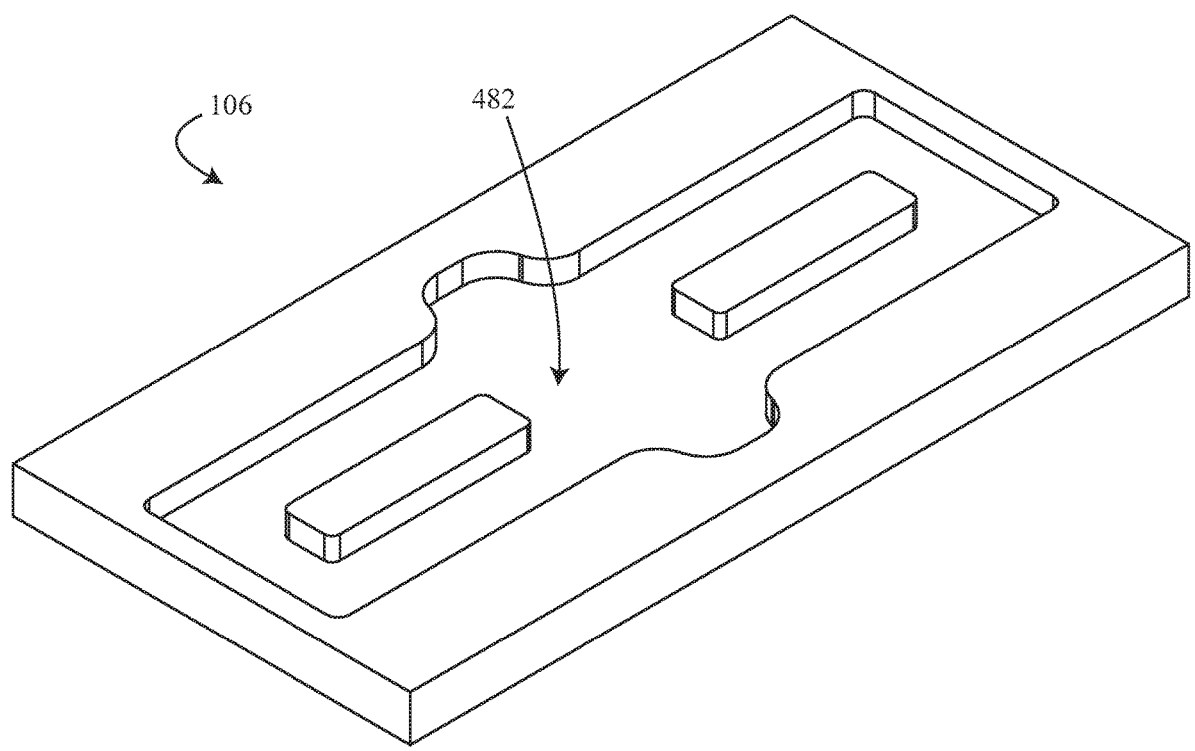
FIG. 4 is a schematic perspective view of a substrate of the electrostatic scanner of FIG. 1 in examples of the present disclosure.

FIG. 4 is a schematic perspective view of a substrate 106 of the electrostatic scanner 100 of FIG. 1 in examples of the present disclosure. The substrate 106 has a recess 482 to receive rotated mirror, a plurality of rotated out-of-plane comb assemblies and a plurality of rotated in-plane comb assemblies.

FIG. 5 is an exploded plot of the electrostatic scanner 100 of FIG. 1 having a first Wheatstone bridge circuitry 140 above other components in examples of the present disclosure. The first Wheatstone bridge circuitry 140 comprises a first junction 542, a second junction 544, a third junction 546 and a fourth junction 548. The first leg 542A is between the first junction 542 and the second junction 544. The second leg 544A is between the second junction 544 and the third junction 546. The third leg 546A is between the third junction 546 and the fourth junction 548. The fourth leg 548A is between the fourth junction 548 and the first junction 542. The first mid-range slow-scan spring 522 is directly attached to the first post 552. The second mid-range slow-scan spring 524 is directly attached to the second post 554. The first wire 182 connects the first post 552 to the first junction 542. The second wire 184 connects the second post 554 to the second junction 544.

The first leg 542A includes the first wire 182, the first post 552, the portion 542B, the second post 554 and the second wire 184. The portion 542B includes the first mid-range slow-scan spring 522, the first fast-scan spring 572, the mirror 120, the second fast-scan spring 574, the second mid-range slow-scan spring 524 and the plurality of mid-range connecting sections 242 of FIG. 2. The portion 542B of the first leg 542A of the first Wheatstone bridge circuitry 140 forms a rotational symmetry of order 2 with respect to the Z-axis.

In examples of the present disclosure, the second junction 544 is connected to a ground.

In examples of the present disclosure, a first resistance of the first leg 542A is between 194 ohms and 721 ohms. A second resistance of the second leg 544A is between 200 ohms and 700 ohms. A third resistance of the third leg 546A is between 200 ohms and 700 ohms. A fourth resistance of the fourth leg 548A is between 200 ohms and 700 ohms. A change of the first resistance induced by stresses developed in the first mid-range slow-scan spring 522, the second mid-range slow-scan spring 524, the first fast-scan spring 572 and the second fast-scan spring 574 when the mirror 120 is at a deflected state is within 10% of the first resistance when the mirror 120 is at an un-deflected state. In examples of the present disclosure, the device layer 102 is made of a silicon material. The silicon material is a piezo-resistive material. In a manufacturing process, a wafer-to-wafer resistivity variation is large, for example, from 200 ohms to 700 ohms. The resistivity variation of a same wafer is small, for example, within 3% variation.

A resistance signal of the first leg 542A of the first Wheatstone bridge circuitry 140 in a time domain has a low frequency component and a high frequency component because the first leg 542A includes the first mid-range slow-scan spring 522, the second mid-range slow-scan spring 524, the first fast-scan spring 572 and the second fast-scan spring 574. In examples of the present disclosure, the low frequency component is in a range from 59 hertz to 61 hertz. The high frequency component is in another range from 27,000 hertz to 29,000 hertz.

Figure 6:
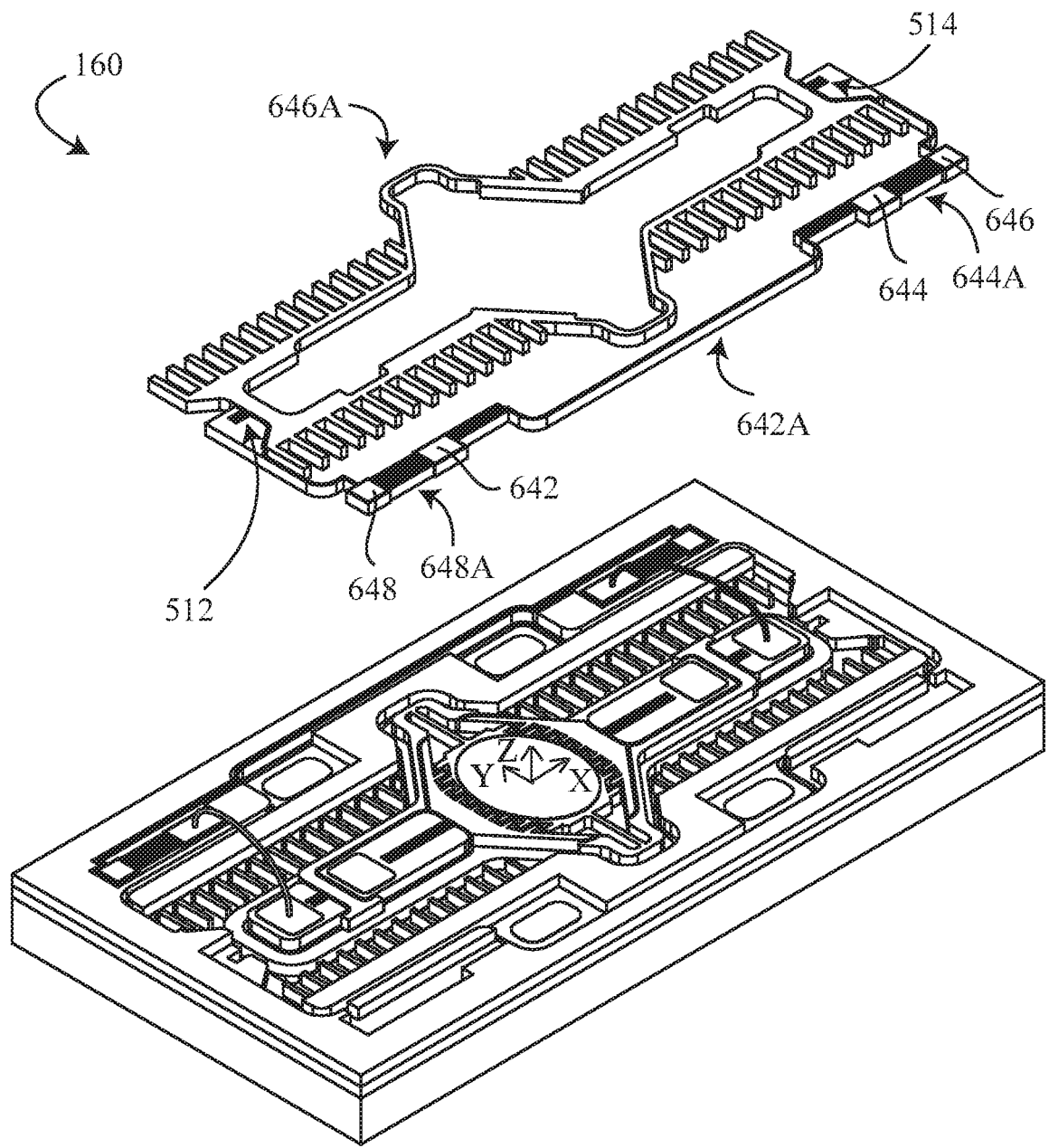
FIG. 6 is an exploded plot of the electrostatic scanner of FIG. 1 having a second Wheatstone bridge circuitry above other components in examples of the present disclosure.

FIG. 6 is an exploded plot of the electrostatic scanner 100 of FIG. 1 having a second Wheatstone bridge circuitry 160 above other components in examples of the present disclosure. The second Wheatstone bridge circuitry 160 comprises a first slow-scan junction 642, a second slow-scan junction 644, a third slow-scan junction 646 and a fourth slow-scan junction 648. A first slow-scan leg 642A between the first slow-scan junction 642 and the second slow-scan junction 644. A second slow-scan leg 644A between the second slow-scan junction 644 and the third slow-scan junction 646. A third slow-scan leg 646A between the third slow-scan junction 646 and the fourth slow-scan junction 648. A fourth slow-scan leg 648A between the fourth slow-scan junction 648 and the first slow-scan junction 642. The first outer slow-scan spring 512 and the second outer slow-scan spring 514 are electrically and mechanically connected (through the plurality of outer connecting sections 582 of FIG. 5) forming a portion of the third slow-scan leg 646A of the second Wheatstone bridge circuitry 160.

In examples of the present disclosure, the third slow-scan junction 646 is connected to a ground.

In examples of the present disclosure, a first slow-scan resistance of the first slow-scan leg 642A is between 200 ohms and 700 ohms. A second slow-scan resistance of the second slow-scan leg 644A is between 200 ohms and 700 ohms. A third slow-scan resistance of the third slow-scan leg 646A is between 194 ohms and 721 ohms. A fourth slow-scan resistance of the fourth slow-scan leg 648A is between 200 ohms and 700 ohms. A change of the third slow-scan resistance induced by stresses developed in the first outer slow-scan spring 512 and the second outer slow-scan spring 514 when the mirror 120 is at a deflected state is within 10% of the third slow-scan resistance when the mirror 120 is at an un-deflected state.

In examples of the present disclosure, a slow-scan resistance signal of the third slow-scan leg 646A of the second Wheatstone bridge circuitry 160 in a time domain has a low frequency component in a range from 59 hertz to 61 hertz because the third slow-scan leg 646A includes the first outer slow-scan spring 512 and the second outer slow-scan spring 514.

Figure 7:
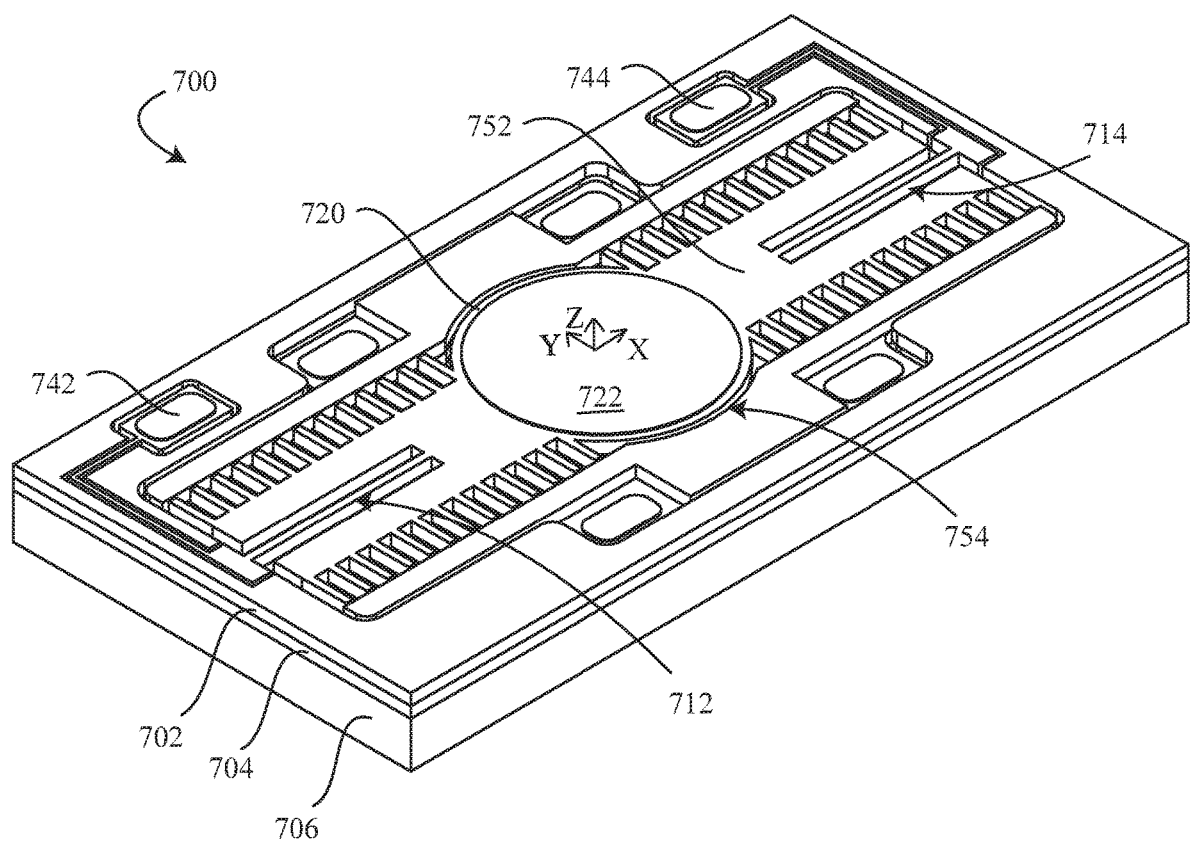
FIG. 7 is a schematic perspective view of another electrostatic scanner in examples of the present disclosure.

FIG. 7 is a schematic perspective view of an electrostatic scanner 700 having a resistance monitoring circuitry in examples of the present disclosure. The resistance can be measured and monitored from a first pad 742 and a second pad 744. The electrostatic scanner 700 includes a device layer 702, a supporting layer 704 and a substrate 706 along the Z-axis. The electrostatic scanner 700 has a mirror 720, a first outer slow-scan spring 712, a second outer slow-scan spring 714, the first pad 742 and the second pad 744. In examples of the present disclosure, the mirror 720 rotates about the X-axis at a slow-scan frequency in a range from 59 hertz to 61 hertz. The first outer slow-scan spring 712 and the second outer slow-scan spring 714 are to rotate about the X-axis. A layer of coating 722 is deposited on the mirror 720. In one example, the layer of coating 722 is made of a silver material. In another example, the layer of coating 722 is made of a gold material.

The first outer slow-scan spring 712 and the second outer slow-scan spring 714 are electrically and mechanically connected forming a portion 752 of a slow-scan leg of a circuitry. A first end of the portion 752 is electrically and mechanically connected to the first pad 742. A second end of the portion 752 is electrically and mechanically connected to the second pad 744. A plurality of trenches 754 separate the leg of the circuity between the first pad 742 and the second pad 744 from other components of the device layer 702 of the electrostatic scanner 700. Resistance measurement is conducted at between the first pad 742 and the second pad 744. Resistance variation induced by stresses developed in the first outer slow-scan spring 712 and the second outer slow-scan spring 714 during rotation of the mirror 720 is monitored. A value of resistance variation is used to determine a corresponding rotation angle of the mirror.

Figure 8:
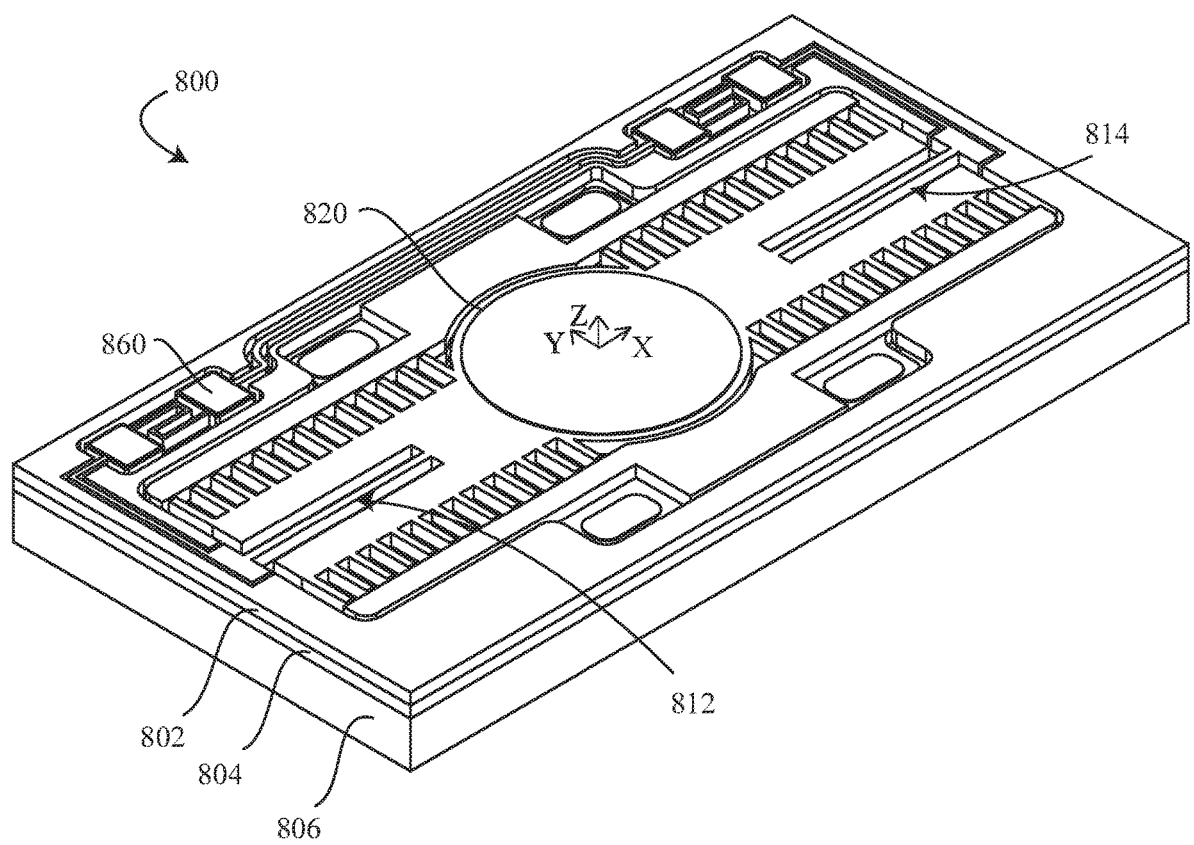
FIG. 8 is a schematic perspective view of still another electrostatic scanner in examples of the present disclosure.

FIG. 8 is a schematic perspective view of still an electrostatic scanner 800 in examples of the present disclosure. The electrostatic scanner 800 includes a device layer 802, a supporting layer 804 and a substrate 806 along the Z-axis. The electrostatic scanner 800 has a mirror 820, a first outer slow-scan spring 812, a second outer slow-scan spring 814 and a slow-scan Wheatstone bridge circuitry 860. In examples of the present disclosure, the mirror 820 rotates about the X-axis at a slow-scan frequency in a range from 59 hertz to 61 hertz. The first outer slow-scan spring 812 and the second outer slow-scan spring 814 are to rotate about the X-axis.

Figure 9:
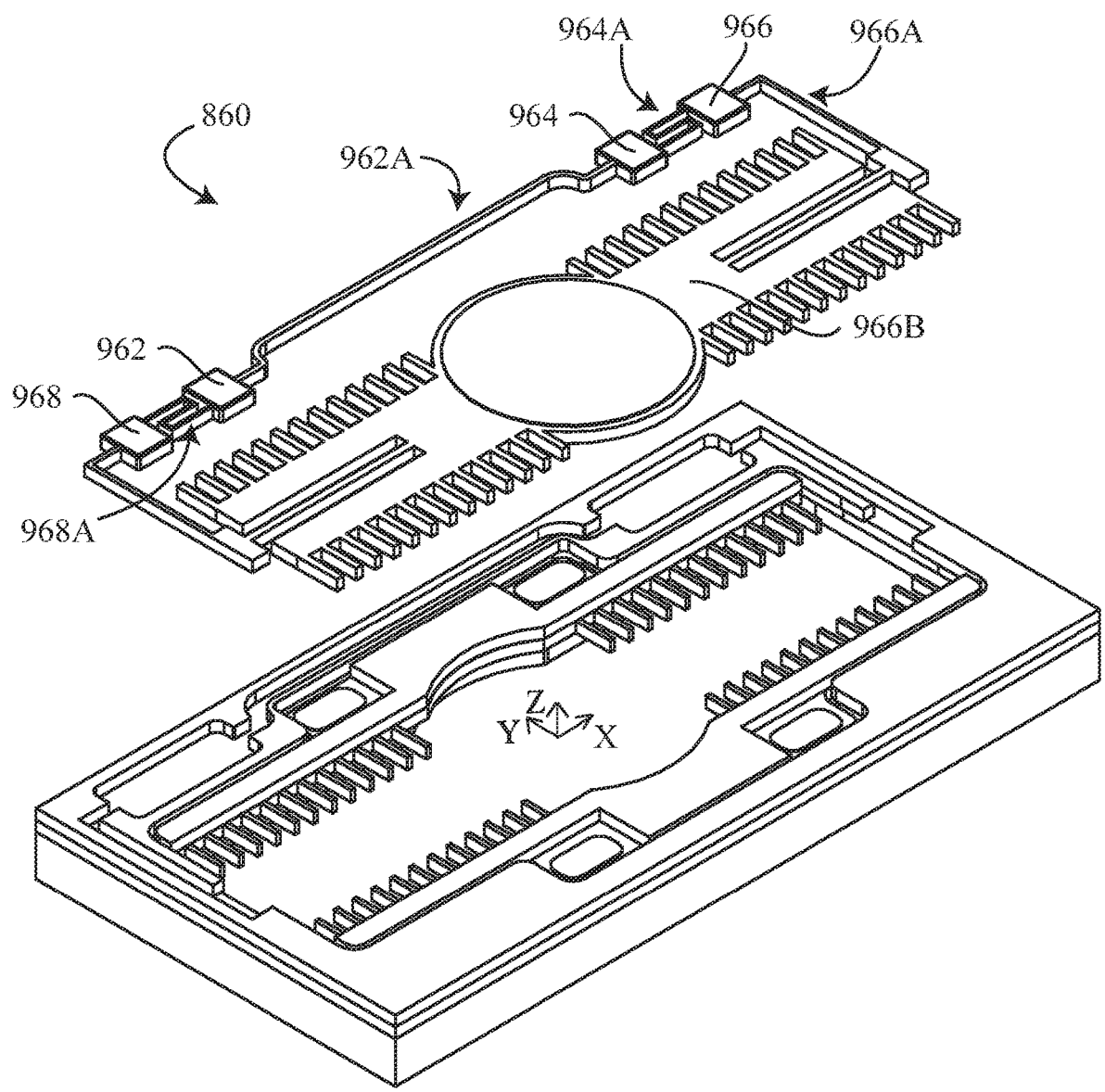
FIG. 9 is an exploded plot of the electrostatic scanner of FIG. 8 having a slow-scan Wheatstone bridge circuitry above other components in examples of the present disclosure.

FIG. 9 is an exploded plot of the electrostatic scanner 800 of FIG. 8 having the slow-scan Wheatstone bridge circuitry 860 above other components in examples of the present disclosure. The slow-scan Wheatstone bridge circuitry 860 comprises a first slow-scan junction 962, a second slow-scan junction 964, a third slow-scan junction 966 and a fourth slow-scan junction 968. A first slow-scan leg 962A between the first slow-scan junction 962 and the second slow-scan junction 964. A second slow-scan leg 964A between the second slow-scan junction 964 and the third slow-scan junction 966. A third slow-scan leg 966A between the third slow-scan junction 966 and the fourth slow-scan junction 968. A fourth slow-scan leg 968A between the fourth slow-scan junction 968 and the first slow-scan junction 962. The first outer slow-scan spring 812 and the second outer slow-scan spring 814 are electrically and mechanically connected so as to form a portion 966B of the third slow-scan leg 966A of the slow-scan Wheatstone bridge circuitry 860. In examples of the present disclosure, the third slow-scan junction 966 is connected to a ground.

Those of ordinary skill in the art may recognize that modifications of the embodiments disclosed herein are possible. For example, the shape and the size of the mirror may vary. Other modifications may occur to those of ordinary skill in this art, and all such modifications are deemed to fall within the purview of the present invention, as defined by the claims.

The invention claimed is:

1. An electrostatic scanner comprising:
   a mirror to rotate about a first direction;
   a first outer slow-scan spring to rotate about the first direction;
   a second outer slow-scan spring to rotate about the first direction;
   a first mid-range slow-scan spring to rotate about the first direction;
   a second mid-range slow-scan spring to rotate about the first direction;
   a first inner slow-scan spring to rotate about the first direction;
   a second inner slow-scan spring to rotate about the first direction;
   a first fast-scan spring to rotate about a second direction perpendicular to the first direction; and
   a second fast-scan spring to rotate about the second direction;
   wherein the first outer slow-scan spring and the second outer slow-scan spring are electrically and mechanically connected forming a portion of a slow-scan leg of a resistance monitoring circuitry;
wherein the mirror is further to rotate about the second direction;
wherein the first mid-range slow-scan spring is between the first outer slow-scan spring and the first inner slow-scan spring;
wherein the second mid-range slow-scan spring is between the second outer slow-scan spring and the second inner slow-scan spring;
wherein the first inner slow-scan spring is between the first mid-range slow-scan spring and the mirror;
wherein the second inner slow-scan spring is between the second mid-range slow-scan spring and the mirror;
wherein the mirror is between the first inner slow-scan spring and the second inner slow-scan spring;
wherein the mirror is between the first fast-scan spring and the second fast-scan spring;
wherein the first mid-range slow-scan spring, the first fast-scan spring, the mirror, the second fast-scan spring and the second mid-range slow-scan spring are electrically and mechanically connected forming a portion of a first leg of a mixed-scan Wheatstone bridge circuitry;
wherein the portion of the first leg of the mixed-scan Wheatstone bridge circuitry is electrically isolated from the first outer slow-scan spring; and
wherein the portion of the first leg of the mixed-scan Wheatstone bridge circuitry is electrically isolated from the first inner slow-scan spring.

2. The electrostatic scanner of claim 1, wherein the electrostatic scanner includes a device layer, an insulation layer, a supporting layer and a substrate along a third direction perpendicular to the first direction and the second direction;
wherein the device layer includes the portion of the first leg of the mixed-scan Wheatstone bridge circuitry, the first outer slow-scan spring and the second outer slow-scan spring;
wherein the supporting layer includes a supporting frame;
wherein the portion of the first leg of the mixed-scan Wheatstone bridge circuitry, the first outer slow-scan spring and the second outer slow-scan spring are attached to a portion of the insulation layer;
wherein the portion of the insulation layer is directly attached to the supporting frame;
wherein the portion of the first leg of the mixed-scan Wheatstone bridge circuitry and the first outer slow-scan spring are not mechanically connected and are separated by a first plurality of trenches; and
wherein the portion of the first leg of the mixed-scan Wheatstone bridge circuitry and the first inner slow-scan spring are not mechanically connected and are separated by a second plurality of trenches.

3. The electrostatic scanner of claim 2, wherein the device layer is made of a silicon material; the insulation layer is made of a silicon dioxide material; the supporting layer is made of the silicon material; and the substrate is made of a glass material.

4. The electrostatic scanner of claim 1, wherein the portion of the first leg of the mixed-scan Wheatstone bridge circuitry forms a rotational symmetry of order 2 with respect to an axis passing through a center point of the mirror; wherein the axis is parallel to a third direction and wherein the third direction is perpendicular to the first direction and is perpendicular to the second direction.

5. The electrostatic scanner of claim 1, wherein the electrostatic scanner further comprises
a first post;
a second post;
wherein the mixed-scan Wheatstone bridge circuitry comprises
a first junction;
a second junction;
a third junction;
a fourth junction;
the first leg between the first junction and the second junction;
a second leg between the second junction and the third junction;
a third leg between the third junction and the fourth junction; and
a fourth leg between the fourth junction and the first junction.
wherein the first mid-range slow-scan spring is directly attached to the first post;
wherein the second mid-range slow-scan spring is directly attached to the second post;
wherein a first wire connects the first post to the first junction;
wherein a second wire connects the second post to the second junction.

6. The electrostatic scanner of claim 5, wherein the second junction is connected to a ground.

7. The electrostatic scanner of claim 5, wherein a first resistance of the first leg is between 194 ohms and 721 ohms;
a second resistance of the second leg is between 200 ohms and 700 ohms;
a third resistance of the third leg is between 200 ohms and 700 ohms;
a fourth resistance of the fourth leg is between 200 ohms and 700 ohms; and
a change of the first resistance induced by stresses developed in the first mid-range slow-scan spring, the second mid-range slow-scan spring, the first fast-scan spring and the second fast-scan spring when the mirror is at a deflected state is within ten percent of the first resistance when the mirror is at an un-deflected state.

8. The electrostatic scanner of claim 5, wherein a resistance signal of the first leg of the mixed-scan Wheatstone bridge circuitry in a time domain has a low frequency component and a high frequency component.

9. The electrostatic scanner of claim 8, wherein the low frequency component is in a range from 59 hertz to 61 hertz and the high frequency component is in another range from 27,000 hertz to 29,000 hertz.

10. The electrostatic scanner of claim 5, wherein the resistance monitoring circuitry is a slow-scan Wheatstone bridge circuitry and wherein the slow-scan Wheatstone bridge circuitry comprises
a first slow-scan junction;
a second slow-scan junction;
a third slow-scan junction;
a fourth slow-scan junction;
a first slow-scan leg between the first slow-scan junction and the second slow-scan junction;
a second slow-scan leg between the second slow-scan junction and the third slow-scan junction;
a third slow-scan leg between the third slow-scan junction and the fourth slow-scan junction; and
a fourth slow-scan leg between the fourth slow-scan junction and the first slow-scan junction;

wherein the portion of the slow-scan leg is a portion of the third slow-scan leg of the slow-scan Wheatstone bridge circuitry.

11. The electrostatic scanner of claim 10, wherein the third slow-scan junction is connected to a ground.

12. The electrostatic scanner of claim 10, wherein a first slow-scan resistance of the first slow-scan leg is between 200 ohms and 700 ohms;
   a second slow-scan resistance of the second slow-scan leg is between 200 ohms and 700 ohms;
   a third slow-scan resistance of the third slow-scan leg is between 194 ohms and 721 ohms;
   a fourth slow-scan resistance of the fourth slow-scan leg is between 200 ohms and 700 ohms; and
   a change of the third slow-scan resistance induced by stresses developed in the first outer slow-scan spring and the second outer slow-scan spring when the mirror is at a deflected state is within ten percent of the third slow-scan resistance when the mirror is at an undeflected state.

13. The electrostatic scanner of claim 10, wherein a slow-scan resistance signal of the third slow-scan leg of the slow-scan Wheatstone bridge circuitry in a time domain has a low frequency component in a range from 59 hertz to 61 hertz.

14. The electrostatic scanner of claim 1, the resistance monitoring circuitry is a slow-scan Wheatstone bridge circuitry.

* * * * *